US009601194B2

(12) United States Patent
Nazarian

(10) Patent No.: US 9,601,194 B2
(45) Date of Patent: Mar. 21, 2017

(54) NAND ARRAY COMPRISING PARALLEL TRANSISTOR AND TWO-TERMINAL SWITCHING DEVICE

(71) Applicant: Crossbar, Inc., Santa Clara, CA (US)

(72) Inventor: Hagop Nazarian, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 60 days.

(21) Appl. No.: 14/194,402

(22) Filed: Feb. 28, 2014

(65) Prior Publication Data
US 2015/0248931 A1 Sep. 3, 2015

(51) Int. Cl.
*G11C 11/00* (2006.01)
*G11C 13/00* (2006.01)
(Continued)

(52) U.S. Cl.
CPC ........ *G11C 13/004* (2013.01); *G11C 11/1659* (2013.01); *G11C 11/56* (2013.01); *G11C 11/5607* (2013.01); *G11C 11/5614* (2013.01); *G11C 11/5664* (2013.01); *G11C 11/5678* (2013.01); *G11C 11/5685* (2013.01);
(Continued)

(58) Field of Classification Search
CPC ... G11C 13/004; G11C 11/1659; G11C 11/56; G11C 2213/75; G11C 11/5607; G11C 11/5614; G11C 11/5664; G11C 11/5678; G11C 11/5685; G11C 13/0002; G11C 13/0004; G11C 13/0007; G11C 13/0011;
(Continued)

(56) References Cited

U.S. PATENT DOCUMENTS

| 8,634,257 B2 * | 1/2014 | Hanzawa | G11C 13/0004 365/148 |
| 2004/0174732 A1 * | 9/2004 | Morimoto | G11C 11/5685 365/148 |

(Continued)

OTHER PUBLICATIONS

International Search Report for PCT Application No. US2015/017360 dated Jun. 8, 2015, 2 pages.
Taiwanese Search Report for Taiwanese Patent Application No. 104106202 dated May 24, 2016, 18 pages.

*Primary Examiner* — Fernando Hidalgo
(74) *Attorney, Agent, or Firm* — Amin, Turocy & Watson, LLP

(57) ABSTRACT

Providing for a high performance and efficiency NAND architecture is described herein. By way of example, a NAND array is disclosed comprising memory cells having a 1 transistor-1 two-terminal memory device (1T-1D) arrangement. Memory cells of the NAND array can be arranged electrically in serial with respect to each other, from source to drain. Moreover, respective memory cells comprise a transistor component connected in parallel to a two-terminal memory device. In some embodiments, a resistance of the activated transistor component is selected to be substantially less than that of the two-terminal memory device, and the resistance of the deactivated transistor component is selected to be substantially higher than the two-terminal memory device. Accordingly, by activating or deactivating the transistor component, a signal applied to the memory cell can be shorted past the two-terminal memory device, or directed through the two-terminal memory device, respectively.

20 Claims, 10 Drawing Sheets

(51) Int. Cl.
    *G11C 11/16*     (2006.01)
    *G11C 11/56*     (2006.01)
    *H01L 27/24*     (2006.01)

(52) U.S. Cl.
    CPC ........ *G11C 13/0002* (2013.01); *G11C 13/003* (2013.01); *G11C 13/0004* (2013.01); *G11C 13/0007* (2013.01); *G11C 13/0011* (2013.01); *G11C 13/0014* (2013.01); *G11C 13/0069* (2013.01); *H01L 27/2436* (2013.01); *H01L 27/2463* (2013.01); *G11C 2213/75* (2013.01)

(58) Field of Classification Search
    CPC .............. G11C 13/0014; G11C 13/003; G11C 13/0069; H01L 27/2436
    USPC ........................................................ 365/148
    See application file for complete search history.

(56) References Cited

U.S. PATENT DOCUMENTS

| | | |
|---|---|---|
| 2005/0226035 A1 | 10/2005 | Ghodsi |
| 2008/0101124 A1 | 5/2008 | Sivero et al. |
| 2009/0154218 A1 | 6/2009 | Bertin et al. |
| 2009/0250678 A1 | 10/2009 | Osano et al. |
| 2012/0236650 A1* | 9/2012 | Nazarian ............ G11C 13/0007 365/185.18 |
| 2012/0287697 A1 | 11/2012 | Hanzawa et al. |

* cited by examiner

NAND ARRAY COMPRISING PARALLEL TRANSISTOR AND TWO-TERMINAL SWITCHING DEVICE

TECHNICAL FIELD

The subject disclosure relates generally to electronic memory, e.g., including improved efficiency and performance for a NAND memory array comprised of a set of parallel transistors and two-terminal switching devices arranged respectively in electrical parallel.

BACKGROUND

The inventors of the present disclosure have been focusing research in the area of resistive memory within the field of integrated circuit technology. While much of resistive memory technology is in the development stage, various technological concepts for resistive memory have been demonstrated by the inventors, and are in one or more stages of verification to prove or disprove associated theory(ies). The inventors believe that resistive memory technology promises to hold substantial advantages over semiconductor transistor-based technologies in the electronics industry.

The semiconductor transistor has been the basis of electronic memory and processing devices for the past several decades. Over time, advancement in technology has roughly followed Moore's Law, which predicts an increase in a number of semiconductor devices, such as transistors, that can be fabricated on a given geometric area of a semiconductor chip. One implication of increasing number of semiconductor devices is increasing memory capacity and processing power for the semiconductor chip and associated electronic devices. Moore's Law has been fairly accurate at predicting the advancement of semiconductor technology up to the present.

The inventors of the disclosed subject matter have worked with two-terminal memory devices, such as resistive memory, as a replacement for three-terminal semiconductor transistors. Based on their experience in the field, mathematical predictions and test results, the inventors believe that two-terminal memory devices can overcome drawbacks of three-terminal semiconductor transistors, e.g., deployed in Flash memory, in various categories related to performance and reliability. Examples include write, erase and access times, data reliability, device density, and others. Accordingly, the inventors are in the process of discovering new ways to create or fabricate two-terminal memory technologies and how they can replace conventional micro electronic systems and devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure provide for a high speed two-terminal memory-based NAND architecture for electronic memory. The inventors of the present disclosure expect the disclosed two-terminal memory-based NAND architecture(s) to have faster write and erase times comparable to conventional NAND, as well as access times that are much faster than the conventional NAND. Furthermore, the disclosed NAND architecture(s) can have improved data longevity, a reduced probability of bit errors, as well as other benefits.

In one or more embodiments, a two-terminal memory-based NAND architecture according to the present disclosure can have a 1 transistor-1 two-terminal memory device (IT-1D) arrangement. The 1T-1D arrangement can be provided as an array of memory cells arranged electrically in serial, with each memory cell comprising a transistor connected in parallel to a two-terminal memory device. According to this embodiment(s), the NAND architecture can facilitate a relatively high memory density in conjunction with improved performance. Unlike conventional NAND Flash, for instance, the parallel 1T-1D arrangement can facilitate fast read times for selected memory cells on the array of memory cells.

In additional embodiments, individual memory cells of a disclosed two-terminal memory-based NAND architecture can be accessed for a program operation. This can facilitate a high operation granularity; mitigating or avoiding inefficiencies associated with page access or block access characteristics of other NAND architectures, such as NAND Flash. For single cell access, a transistor of a selected cell can be deactivated, or set to a non-conductive state, whereas transistors of non-selected cells can be activated, or set respectively to a conductive state. A read signal can primarily bypass two-terminal memory devices of non-selected cells, through respective conducting transistors of those memory cells. With respect to the selected cell, however, the deactivated transistor will cause the read signal to propagate primarily through the two-terminal memory device, facilitating determining a state of the two-terminal memory device of the selected cell, and thereby reading a state of the selected cell. Minimizing capacitance of the array of memory cells can facilitate even further improvements of the read times.

According to at least one embodiment, a two-terminal memory device employed for one or more disclosed NAND architectures can be a resistive memory device. In other embodiments, the two-terminal memory device can be a ferromagnetic memory, a phase change memory, a magneto-resistive memory, an organic memory, a conductive bridging memory, or the like. In at least one embodiment, the two-terminal memory device can be a resistive random access memory.

In an embodiment, the subject disclosure provides a memory. The memory can comprise a substrate, and an array of memory cells formed at least in part within the substrate and arranged electrically in series from respective first terminals to respective second terminals of respective ones of the memory cells. According to one or more aspects of this embodiment, at least one of the memory cells of the array comprises a transistor component connected electrically in parallel with a two-terminal multi-state component and a signal applied to the array of memory cells propagates through the at least one of the memory cells primarily via the transistor component in response to the transistor component being activated. In alternative or additional aspects, the signal propagates through the at least one of the memory cells primarily via the two-terminal multi-state component in response to the transistor component being de-activated.

According to another embodiment, the subject disclosure provides a method of fabricating a memory. The method can comprise forming a channel region for an array of transistors in a semiconductor substrate, the channel region arranging the array of transistors electrically in series from source to drain and forming a set wordlines for the memory that serve as respective control gates for respective ones of the array of transistors. Furthermore, the method can comprise forming a set of two terminal switching devices arranged electrically in series from respective first terminals to respective second terminals of the set of two terminal switching devices and connecting one of the set of two terminal switching devices in parallel with one of the array of transistors.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
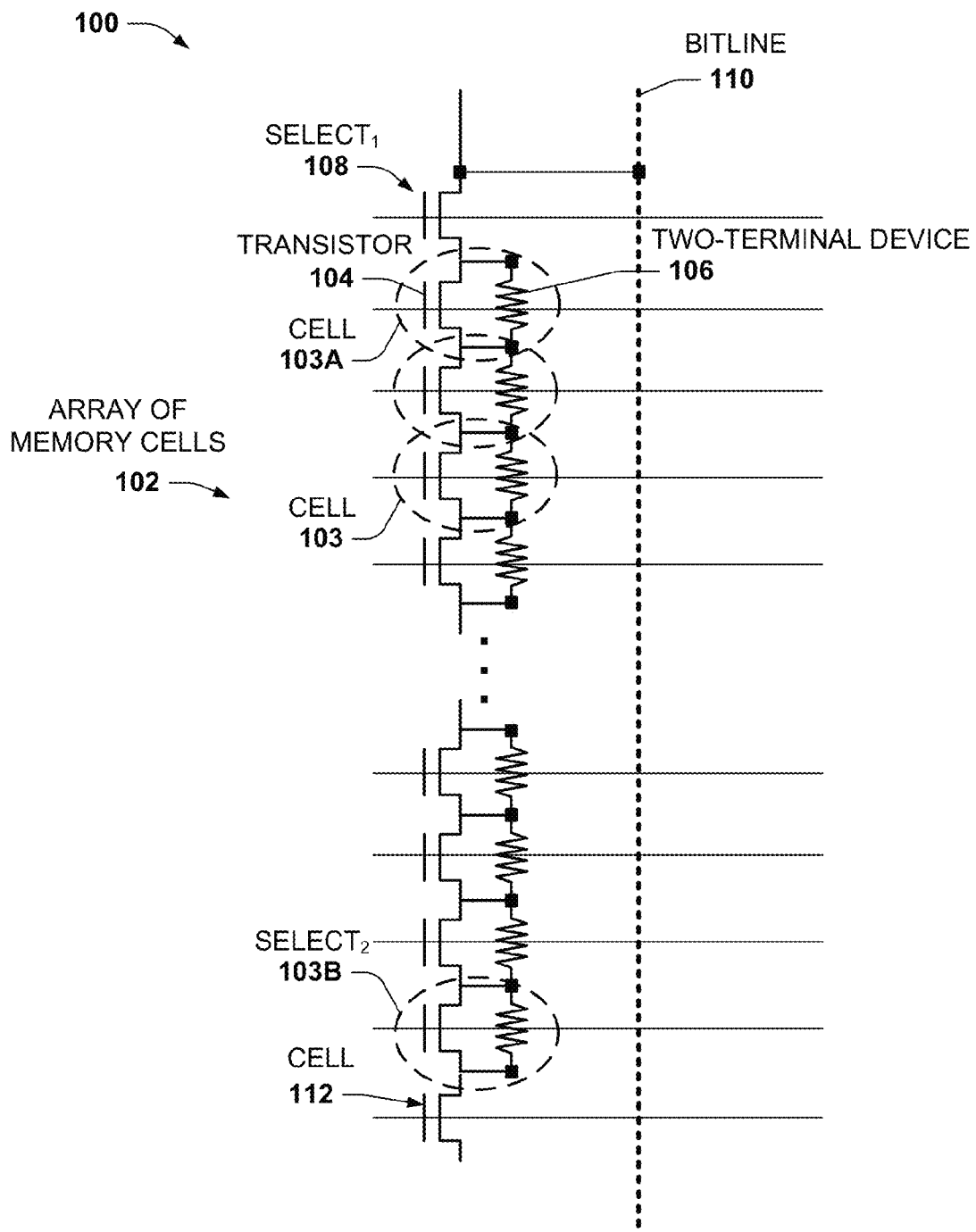
FIG. 1 depicts a schematic diagram of an example two-terminal memory NAND architecture according to one or more embodiments disclosed herein.

This disclosure relates to two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, . . . ), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide, and so forth. Examples of the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

The subject disclosure provides for improved efficiency and effectiveness in memory. In various embodiments of the subject disclosure, disclosed memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 9 and 10, infra).

NAND FLASH is employed for compact FLASH devices, USB devices, SD cards, solid state drives (SSDs), and storage class memory, as well as other form-factors. The inventors of the present application believe that NAND has proven a successful technology in fueling the drive to scale down to smaller devices and higher chip densities over the past decade. However, as technology scaled down past 25 nanometer (nm) memory cell technology, the inventors believe that several structural, performance and reliability problems became evident. For instance, bit error rates (BERs) increased significantly, while memory cycling (related to memory endurance) decreased. In addition, the inventors understand that NAND has conventional drawbacks, including relatively slow read speeds or latency, due to high capacitive coupling between arrays of memory. As technologies scale downward and spacing between memory arrays on a semiconductor die become smaller, this capacitive problem can be exacerbated. Many of these or like drawbacks can be mitigated or avoided by the NAND architectures disclosed herein.

In one or more embodiments, disclosed is a NAND architecture comprising a 1 transistor-1 two-terminal memory device (1T-1D) parallel circuit. In at least a subset of those embodiments, the two-terminal memory device can be referred to as a two-terminal multi-state component having at least a first state that is electrically distinguishable (e.g., via an electrical characteristic, such as current, voltage, charge, resistance, and so forth) from at least a second state. The NAND memory array disclosed herein can provide greater efficiency compared with other NAND technologies. In addition, the disclosed NAND architectures can be well suited for three dimensional integration and stacking, leading to higher memory densities. Also disclosed are programming operations for read, write and erase operations for at least a subset of the disclosed NAND architectures. According to some embodiments, a disclosed NAND architecture can comprise an array of memory cells arranged electrically in serial, where respective memory cells comprise a 1T-1D parallel circuit. In one or more embodiments, the two-terminal memory device can comprise a non-volatile resistive-switching device. In at least one embodiment, the two-terminal memory device can comprise a non-volatile resistive random access memory (RRAM). According to other embodiments, the two-terminal memory device can comprise a resistive memory, a ferromagnetic memory, a phase change memory, a magneto-resistive memory, an organic memory, a conductive bridging memory, or the like, or a suitable combination thereof.

Referring now to the drawings, FIG. 1 depicts a schematic diagram of an example NAND circuit 100 according to various disclosed embodiments. NAND circuit 100 can be generated on a semiconductor substrate as part of an integrated chip, in one example. In another example, NAND circuit 100 could be constructed in a three dimensional architecture, for instance, where memory components (e.g., memory cells, transistor components, two-terminal device components, etc.) are constructed vertically above the substrate. Moreover, NAND circuit 100 can be included as a pattern or guide for large numbers of NAND arrays, arranged in blocks, sub-blocks, pages, or the like, or suitable combinations thereof. In addition, NAND circuit 100 can be replicated into a two-dimensional array of NAND circuits, or into multiple two-dimensional arrays stacked in a third dimension. Accordingly, it should be appreciated that NAND circuit 100 and other embodiments of NAND arrays disclosed herein should not be construed as being limited to the depicted embodiment(s), unless clear from context.

NAND circuit 100 can comprise an array of memory cells 102, in which respective memory cells 103 of the array are arranged electrically in serial with other such memory cells 103. Respective memory cells 103 can be comprised of a 1T-1D arrangement including a transistor 104 arranged electrically in parallel with a two-terminal memory device 106. Transistor 104 can be a three-terminal semiconductor transistor of various suitable technologies. Examples can include a field effect transistor (FET) or various derivatives of the FET, such as carbon nanotube FET, metal oxide semiconductor FET (MOSFET), junction FET (JFET), organic FET (OFET), dual-gated FET, Fin-FET, etc., an insulated-gate bipolar transistor, a thin film transistor, and others. Two-terminal memory device 106 can comprise a non-volatile memory device in some aspects. Examples can include a resistive-switching device in at least one aspect. In other aspects, two-terminal memory device 106 can comprise a resistive random access memory, a ferromagnetic memory, a phase change memory, a magneto-resistive memory, an organic memory, a conductive bridging memory, or a suitable combination thereof. Respective memory cells 103 have a first shared node that connects a first transistor terminal of an associated transistor 104 (e.g., source, drain) with a corresponding first terminal of an associated two-terminal memory device 106. A second shared node connects a second transistor terminal (e.g., drain, source) of the associated transistor 104 with a corresponding second terminal of the associated two-terminal memory device 106.

As depicted, respective memory cells 103 of the array of memory cells 102 can be connected in series, in which a second shared node of one memory cell 103 is connected to a first shared node of a subsequent memory cell 103. A first memory cell 103A of the array is connected at a first shared node to a first select transistor 108 (select$_1$ 108) and a last memory cell 103B of the array is connected at a second shared node to a second select transistor 112 (select$_2$ 112). Select' 108 can be activated or deactivated by a select line, and when activated, connects a signal applied to a bitline 110 to the first shared node of first memory cell 103A. Accordingly, the signal (e.g., voltage, current) applied to bitline 110 can be applied to array of memory cells 102 by activation of select$_1$ 108, and the signal can be isolated from array of memory cells 102 by deactivation of select$_1$ 108. Select$_2$ 112 can be activated or deactivated by a source line. A second node of select$_2$ 112 can be connected to ground, a second signal (e.g., a reverse bias, an erase bias, or the like) or a read circuit to facilitate various memory operations for array of memory cells 102 (e.g., see FIG. 3 for signal path through an array of memory cells and an example of such memory operations).

Figure 2:
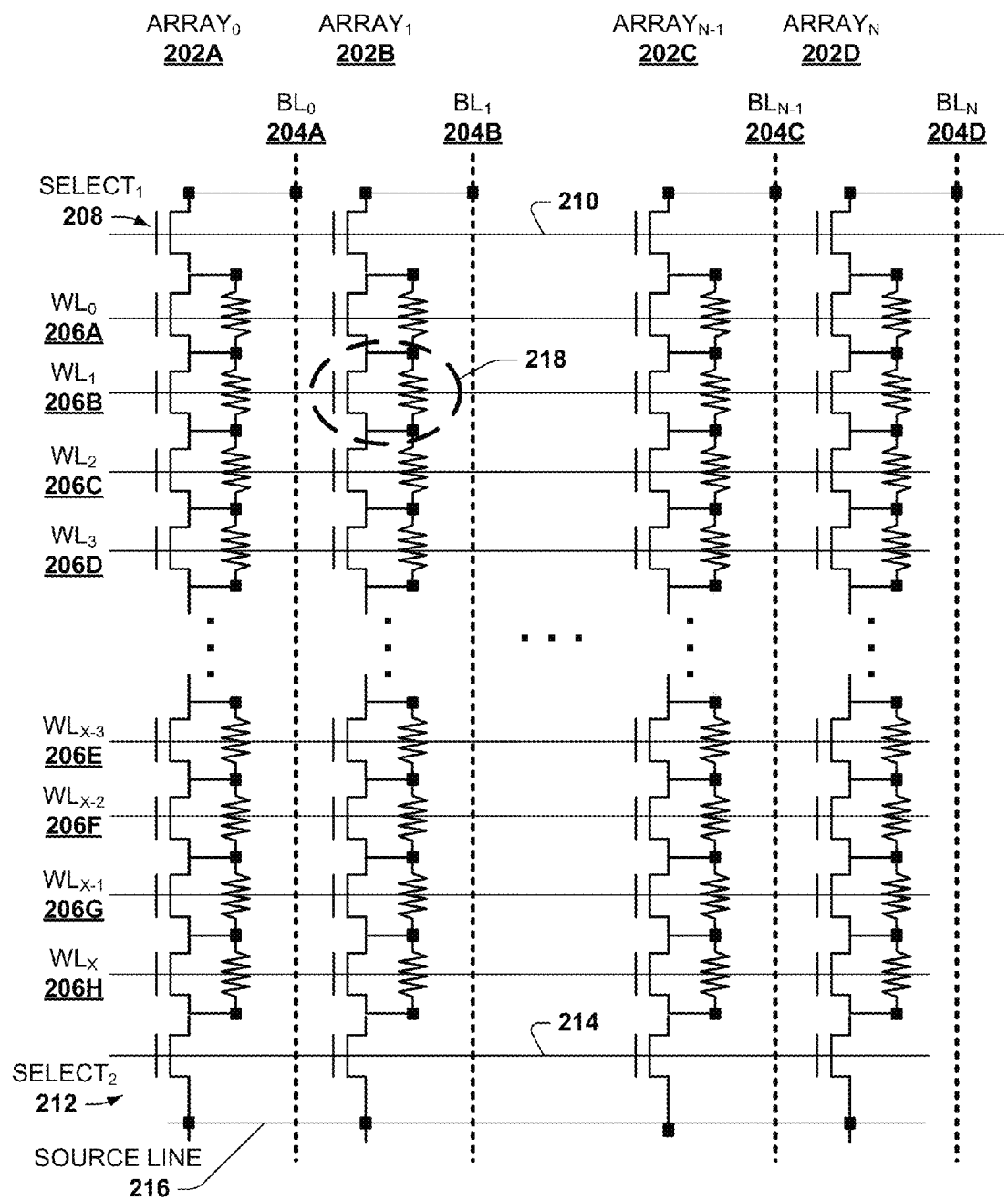
FIG. 2 illustrates a schematic diagram of an example sub-block of memory comprising multiple two-terminal memory NAND arrays in an embodiment(s).

FIG. 2 illustrates a schematic diagram of an example memory architecture 200 according to additional embodiments of the subject disclosure. Memory architecture 200 can comprise multiple NAND memory arrays, including NAND array$_0$ 202A, NAND array$_1$ 202B, through NAND array$_{N-1}$ 202C and NAND array$_N$ 202D (referred to collectively as memory arrays 202A-202D), where N is a suitable integer greater than 1. NAND arrays 202A-202D respectively comprise arrays of memory cells arranged electrically in series from a first shared node (connecting a first transistor terminal and a first two-terminal memory device terminal of a memory cell) to a second shared node (connecting a second transistor terminal and a second two-terminal memory device terminal of the memory cell), as described above at FIG. 1, supra. In addition, the memory cells can each comprise a transistor component arranged electrically in parallel with a two-terminal memory device.

Transistor components of the memory cells of memory architecture 200 can be controlled (e.g., activated, deactivated) by a set of wordlines that form, or are connected to, gates of the transistor components (e.g., a field effect gate, or other suitable gate-operated transistor). Memory architecture 200 can comprise a wordline for each row (e.g., a page) of memory cells, for controlling activation or deactivation of transistor components of respective memory cell rows. Depicted wordlines include WL$_0$ 206A, WL$_1$ 206B, WL$_2$ 206C, WL$_3$ 206D, . . . , WL$_{X-3}$ 206E, WL$_{X-2}$ 206F, WL$_{X-1}$ 206G, WL$_X$ 206H (referred to herein collectively as wordlines 206A-206H), where X is a suitable integer greater than 1. In addition, respective NAND arrays 202A-202D can be connected to or disconnected from respective bitlines of memory architecture 200 by way of a first set of select transistors 208 (select$_1$ transistors 208) controlled by a select line 210. NAND array$_0$ 202A can be connected to or disconnected from BL$_0$ 204A by activation or deactivation, respectively, of select$_1$ transistors 208. Likewise NAND array' can be connected to or disconnected from BL$_1$ 204B, and so on, through NAND array$_{N-1}$ 202C that can be connected to or disconnected from BL$_{N-1}$ 204C and NAND array$_N$ 202D that can be connected to or disconnected from BL$_N$ 204D (the bitlines being referred to hereinafter collectively as bitlines 204A-204D).

In one or more embodiments of the subject disclosure, memory cells of memory architecture 200 can be configured to have transistor components that, when activated, have lower resistance than corresponding two-terminal memory devices of the memory cells. Accordingly, when a transistor component is activated, a signal applied to a memory cell propagates primarily though the activated transistor component. Furthermore, the transistor components can have higher resistance, when deactivated, than the corresponding two-terminal memory devices of the memory cells. The signal applied to the memory cell then propagates primarily through the two-terminal memory device of the memory cell, facilitating memory operations for the memory cell. Example memory operations are described in more detail below.

A signal applied at select line 210 can facilitate controlling activation and deactivation of select$_1$ transistors 208. When deactivated, NAND arrays 202A-202D are electrically isolated from their respective bitlines 204A-204D. When activated, a signal applied at one of bitlines 204A-204D is applied to an associated one of NAND arrays 202A-202D. Likewise, a second select line 214 and second set of select transistors 212 (select$_2$ transistors 212) can connect or isolate NAND arrays 202A-202D to a source line 216 at an opposite end of the respective NAND arrays 202A-202D from select$_1$ transistors 208. Source line 216 can be grounded (e.g., during a read operation or an erase operation for unipolar two-terminal memory devices), set at a forward potential (e.g., during a program operation), set at a reverse potential (e.g., for erasing bipolar two-terminal memory devices), connected to one of bitlines 204A-204D, or the like, to further facilitate selective memory operations on one or more of NAND arrays 202A-202D (e.g., read, write, erase, and so on).

An example of a program operation for a NAND array of FIG. 2 is now described. This example involves selection of a selected memory cell 218 on NAND array' 202B, and programming a two-terminal memory device of selected memory cell 218. Bitline 204B is set to a suitable program voltage for selected memory cell 218 (e.g., about three volts, about five volts, about one and a half volts, or the like), and other bitlines 204A, 204C, 204D of memory architecture 200 are set to zero volts. A voltage greater than the suitable program voltage is applied at select line 210, thereby activating select$_1$ transistors 208 and electrically connecting respective first ends of NAND arrays 202A-202D to their respective bitlines 204A-204D. This applies the suitable program voltage to the first end of NAND array$_1$ 202B, and zero volts to the first ends of NAND arrays 202A, 202C, 202D, respectively. In addition, zero volts is applied to wordline WL$_1$ 206B, thereby deactivating a transistor component of selected memory cell 218, whereas a voltage greater than the suitable program voltage is applied to other wordlines of memory architecture 200, including wordlines 206A, 206C, 206D, 206E, 206F, 206G, 206H, thereby activating transistor components of non-selected memory cells (memory cells of NAND array$_1$ 202B associated with wordlines 206A, 206C, 206D, 206E, 206F, 206G, 206H) on these latter wordlines. Based on selected relative electrical resistances of transistor components and two-terminal memory device components of the memory cells, as described above, by activating the transistor components of non-selected memory cells, a program signal caused by the suitable program voltage primarily bypasses the two-terminal memory devices of the non-selected memory cells, which can leave them unaffected by the program signal. In contrast, by de-activating the transistor component of selected memory cell 218, a program voltage of the program signal appears primarily at the two-terminal memory device of selected memory cell 218. Accordingly, the selected memory cell 218 can be programmed by this program voltage (see, e.g., FIG. 3, infra, for an example of a signal propagation path).

An example erase operation is now described for selected memory cell 218 on NAND array$_1$ 202B. In some embodiments of the subject disclosure, bitline 204B connected to NAND array$_1$ 202B is set to 0 volts, and bitlines 204A, 204C, 204D connected to NAND arrays 202A, 202C, 202D are set to zero volts. Additionally, a voltage greater than a suitable program voltage is applied to select line 210, thereby activating select$_1$ transistors 208, and applying the zero volts at bitlines 204A-204D to a first end of NAND arrays 202A-202D. In addition, wordline WL$_1$ 206B is set to zero volts, deactivating transistor components of memory cells on wordline WL$_1$ 206B (including, e.g., a transistor component of selected memory cell 218), and wordlines 206A, 206C, 206D are set to a voltage suitable to activating respective transistor components of memory cells on these wordlines 206A, 206C, 206D. Furthermore, a suitable erase voltage can be applied to source line 216, and a suitable voltage applied to second select line 214 for activating select$_2$ transistors 212 and applying the suitable erase voltage to the second end of NAND arrays 202A-202D. In the embodiments for which zero volts is applied to bitline 204B, the suitable erase voltage applied at source line 216 can be a positive voltage, resulting in a negative polarity having a magnitude of the positive voltage to be observed at selected memory cell 218. These embodiments can be suitable, for instance, where selected memory cell 218 comprises a bipolar two-terminal memory device (e.g., see FIG. 5, infra). In other embodiments of the subject disclosure, bitline 204B can be set to a suitable positive erase voltage different from the suitable program voltage, and source line 216 can be set to zero volts. These other embodiments can be suitable, for instance, where selected memory cell 218 comprises a unipolar two-terminal memory device (e.g., see FIG. 6, infra).

An example read operation is now described for selected memory cell 218 on NAND array$_1$ 202B. In at least one embodiment, the read operation can comprise a precharge phase and a read phase, in which a precharge voltage (e.g., about 0.5 volts) is applied to bitline 204B for the precharge phase, and then a sensing circuit is applied to bitline 204B for the read phase, to sense whether the 0.5 volt has decayed or stayed constant. Based on the decay or constant measurement at bitline 204B, a state of selected memory cell 218 can be determined. Additionally, zero volts can be applied to bitlines 204A, 204C, 204D, and the suitable program voltage applied to select line 210 thereby activating select$_1$ transistors 208 and electrically connecting NAND arrays 202A-202D to their respective bitlines 204A-204D. The respective bitline voltages are thereby applied to respective first ends of NAND arrays 202A-202D. Further, zero volts can be applied to $WL_1$ 206B, and a voltage greater than the suitable program voltage can be applied to $WL_0$ 206A, $WL_{N-1}$ 206C, $WL_N$ 206D. This deactivates a transistor component of memory cells on $WL_1$ 206B while activating a transistor component of memory cells on $WL_0$ 206A, $WL_{N-1}$ 206C, $WL_N$ 206D. Additionally, zero volts can be applied to source line 216, and the suitable program voltage can be applied to second select line 214, thereby activating $select_2$ transistors 212, and applying the zero volts from source line 216 to a second end of NAND arrays 202A-202D.

An example read operation for determining a state of selected memory cell 218 is now described. Selected memory cell 218 can be selected as described above. During a precharge phase, bitline 204B can be utilized to pass a current through the selected memory cell 218. During a read phase, a sensing circuit can be connected to bitline 204B, to sense the current remaining on bitline 204B. If bitline voltage decays, this indicates selected memory cell 218 is in a conductive state. If the bitline voltage does not decay (e.g., maintains 0.5 volts), this indicates selected memory cell 218 is in a resistive state. Other ways of sensing a state of selected memory cell 218 can be implemented by those of ordinary skill in the art; those other ways known to one of ordinary skill or made known to one of ordinary skill by way of the context provided herein, are considered within the scope of the subject disclosure.

Figure 3:
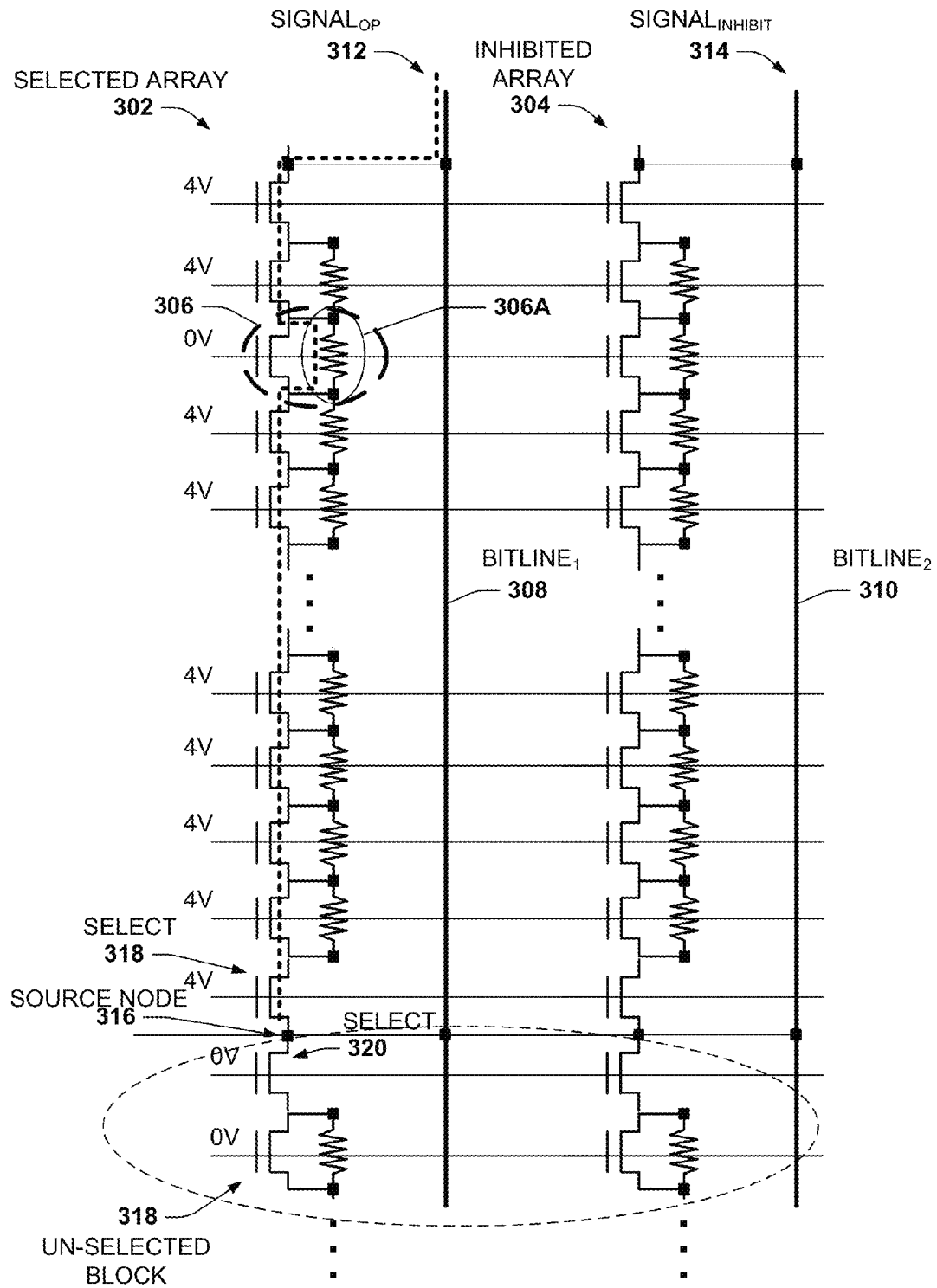
FIG. 3 depicts a schematic diagram of an example signal propagation path for a selected NAND array according to other embodiments.

FIG. 3 illustrates a schematic diagram of an example memory architecture 300 according to one or more additional embodiments of the subject disclosure. In at least one aspect, memory architecture can be substantially similar to memory architecture 200 of FIG. 2, supra. However, the subject disclosure is not limited to this aspect(s). Memory architecture 300 can comprise an arrangement of NAND memory cell arrays, where at least one memory cell of the arrays comprises a transistor component connected electrically in parallel to a two-terminal memory device. Further, the transistor component can have lower electrical resistance when activated than the two-terminal memory device (and this characteristic can be true for all states of the two-terminal memory device). Moreover, the transistor component can have higher electrical resistance when deactivated than the two-terminal memory device (this latter characteristic can be true for all states of the two-terminal memory device). In various embodiments, a deactivation state resistance ratio of the transistor component (when deactivated) versus the two-terminal memory device (in a high resistance state) can be selected to facilitate suitable memory operations for the memory cell (e.g., see FIG. 2, supra), and in other embodiments an activation state resistance ratio of the transistor component (when activated) versus the two-terminal memory device (in a low resistance state) can also be selected to facilitate one or more of the memory operations.

Memory architecture 300 can comprise a NAND array selected for a memory operation (e.g., a program operation), referred to as selected NAND array 302. In addition, memory architecture 300 can comprise a NAND array that is not selected for the memory operation, and moreover is to be unaffected by the memory operation, referred to as inhibited NAND array 304. To facilitate the memory operation for the selected NAND array 302, an operation signal 312 (e.g., a read signal, a program signal, an erase signal, etc.), is applied to a first bitline, $bitline_1$ 308 and to a first end of selected NAND array 302 through a first select transistor. A second select transistor 318 can be activated, thereby connecting a second end of NAND array 302 to a source node 316, where source line can be connected to a positive voltage during an erase operation, for example, or a ground, during read operation, and so forth. A second, inhibited NAND array 304 can be mitigated from programming or erasing by a suitable inhibit signal 314 applied to a second bitline, $bitline_2$ 310, which can be electrically connected to inhibited NAND array 304 by an associated second select transistor.

Note that operation signal 312 can be configured to affect a memory cell or bypass the memory cell by control of a transistor component of the memory cell via a wordline intersecting the memory cell. By individual control of respective wordlines of a set of wordlines of memory architecture 300, transistor components of individual memory cells can be activated or deactivated, configuring associated memory cells to be unaffected by the memory operation, or affected by the memory operation, respectively.

Individual control over activation or deactivation of respective memory cells of memory architecture 300 can provide a great deal of flexibility and efficiency for an associated memory device. For instance, flexibility occurs from a bit-level, byte-level, word-level, etc. of control over a number of memory cells that can be selected for/affected by a memory operation. In one example, the flexibility of control can be achieved by selecting one word, one byte, or even one bit to be programmed, read, erased, overwritten, and so on. This can allow, for instance, writing or rewriting a single bit (or set of bits) to a word, page, block, etc., of memory, or the like. In another example, a low flexibility of control can correspond to memory operations limited to an entire page, block, sub-block, etc., or a substantial subset of the foregoing. The low flexibility can facilitate mass memory operations, writing, rewriting, erasing, etc., on many memory cells via a single operation. Examples of the latter can include a page write, block write (e.g., via multiple page writes), page erase, block erase, and so forth. While single bit or single word operations are possible in some other NAND architectures, the ability to selectively choose between mass memory cell operations and single bit or single word write, rewrite or erase operations is not known particularly for NAND Flash architectures, and particularly with the performance that can be achieved by the two-terminal memory-based NAND architectures provided by the present disclosure. Accordingly, the advantages of the present disclosure can be highly significant for a wide array of applications utilized for NAND memory (e.g., NAND FLASH, and so forth).

As depicted by memory architecture 300, a single selected memory cell 306 (dashed oval) is provided for the memory operation of FIG. 3. A wordline associated with selected memory cell 306 is set to zero volts, thereby deactivating a transistor component of selected memory cell 306. The deactivated transistor component has a high resistance, causing operation signal 312 to propagate primarily through a two-terminal memory device 306A of selected memory cell 306, as depicted by the dotted line indicating the path of operation signal 312. Other wordlines of memory architecture 300 not connected to selected memory cell 306 can be set to a suitable activation voltage (e.g., 4 volts, though the subject disclosure is not so limited), activating respective transistor components of these non-selected memory cells. Accordingly, these transistor components have low resistance compared to their associated respective two-terminal memory devices. Thus, operation signal 312 propagates primarily through the transistor components of these non-selected memory cells, as indicated by the dotted operation signal path. For a program operation, the signal out path 316 can be connected to ground (or another suitable potential). For an erase operation, the signal out path 316 can be connected to a reverse bias (for bipolar memory cells), or to ground (for unipolar memory cells, where operation signal 312 is a suitable erase potential). For a read operation, source node 306 is grounded, and a sensing circuit can be connected to bitline₁ 308 to sense bitline voltage and determine a state of selected memory cell 306.

Note that memory architecture 300 includes two blocks of memory cells, a selected block and an un-selected block 318. The selected block comprises selected NAND array 302 and inhibited NAND array 304. Un-selected block 318 is encircled by the dotted oval at the bottom of FIG. 3, and can be electrically isolated from operations involving the selected block by a set of select transistors 320. Select transistors 320 are deactivated, mitigating or avoiding propagation of operation signal 312 or inhibit signal 314 through memory cells of un-selected block 318. Accordingly, memory architecture 300 can comprise multiple NAND arrays connected in serial, with suitably placed select transistors configured to electrically isolate NAND arrays of separate blocks of memory from other NAND arrays of other blocks of memory.

Figure 4:
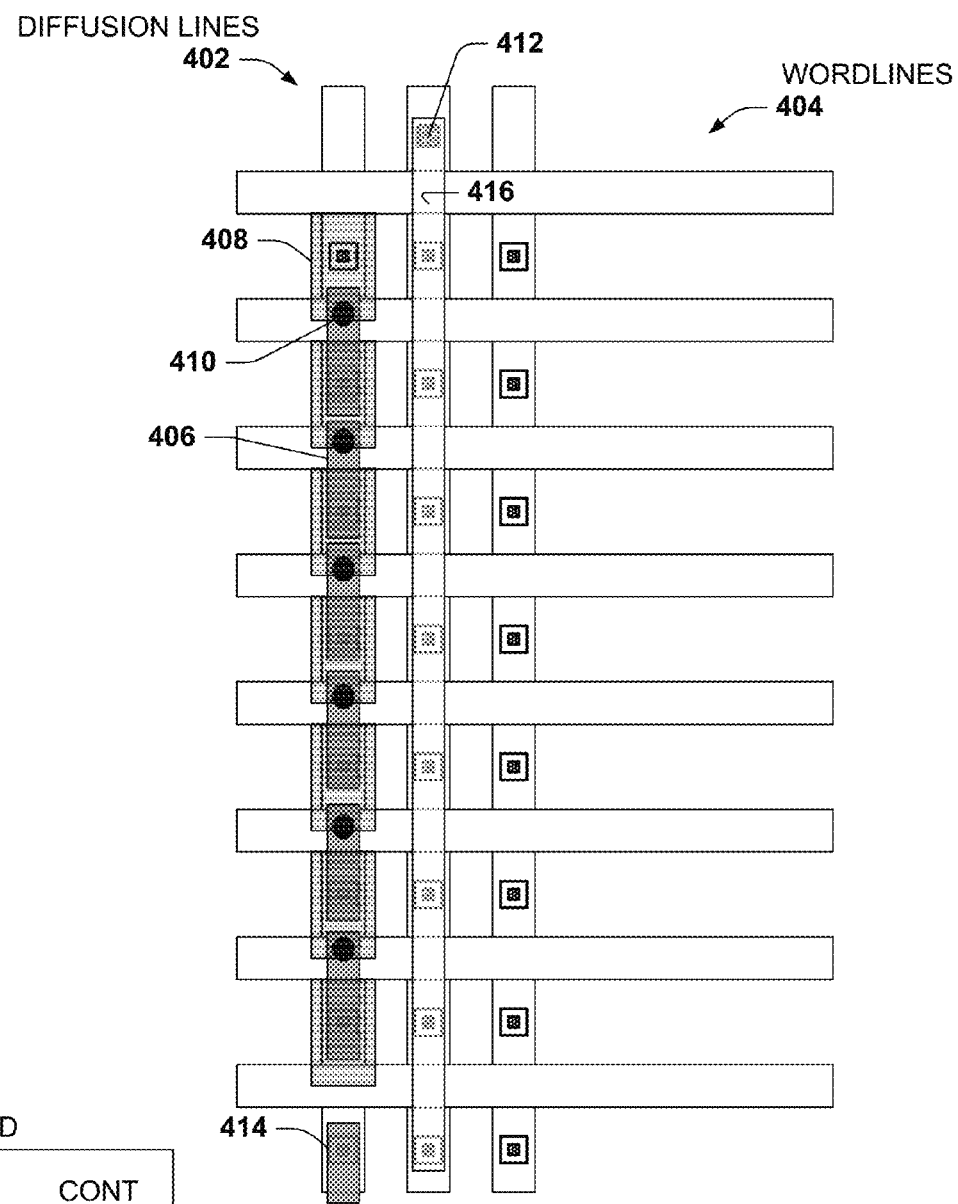
FIG. 4 illustrates a diagram of example layers of a two-terminal memory NAND array comprising two-terminal memory devices according some aspects.

FIG. 4 depicts a block diagram of an example top view of a memory architecture 400 of a NAND array fabricated partially within and partially above a semiconductor substrate according to one or more embodiments of the subject disclosure. Memory architecture 400 can comprise a set of diffusion lines 402 formed within the semiconductor substrate (e.g., a complementary metal oxide semiconductor [CMOS] substrate). Diffusion lines 402 can form channel regions of respective arrays of transistor components of memory architecture 400. Above the semiconductor substrate, a set of wordlines 404 can be formed. Wordlines 404 can form transistor gates of the arrays of transistor components. Above wordlines 404 can be formed a set of interconnects, M1 406. A set of interconnects, M1 interconnects 406 can be a discontinuous line of electrically conductive materials (e.g., a conductive metal) running parallel with one of diffusion lines 402 (e.g., see FIG. 5, infra, M1 interconnects 510). Furthermore, a first set of vertical contacts 412 can be formed to connect respective channel regions of the transistor components to respective ones of M1 interconnects 406, as well as a channel region of a first select transistor (top of diffusion lines 402) to one of M1 interconnects 406, and a channel region of a second select transistor (bottom of diffusion lines 402) to a second one of M1 interconnects 406. Accordingly, respective channel regions of select transistors and memory cell transistor components are in electrical continuity with respective ones of M1 interconnects 406.

A set of two-terminal memory devices (not depicted) can be formed on top of respective M1 interconnects 406, connected respectively at one end to respective ones of M1 interconnects 406. A second set of conductive interconnects, M2 interconnects 408, can be formed above the two-terminal memory devices running parallel with one of diffusion lines 402, and like interconnects M1 406, are disconnected from each other. Additionally, respective M2 interconnects 408 can be connected to a second end of respective ones of the two-terminal memory devices. A second set of vertical vias₂ 410, electrically connect respective ones of interconnects M1 406 to respective ones of M2 interconnects 408. In addition to the foregoing, a bitline 414 can be formed above M2 interconnects 408. Although FIG. 4 illustrates only a single bitline 414, it should be appreciated that similar bitlines 416 can be formed over other diffusion lines 402 of memory architecture 400. A via 2 interconnect 412 can connect a bitline 416 to one of M2 interconnects 408, which in turn is connected by one of the via 1 interconnects to one of M1 interconnects 406 at the top of each diffusion line 402, which is further connected by a contact 414 connecting respective ones of these M1 interconnects 406 to a channel region of a first select transistor at a top of respective diffusion lines 402. Thus, activation or deactivation of the first select transistors can apply a signal from bitlines 416 to the diffusion lines 402 and memory cells of memory architecture 400. Likewise, a second one of contacts 414 connects a second select transistor at a bottom of one of diffusion lines 402 to a source line. The source line can be utilized to apply a suitable ground to diffusion lines 402, connect diffusion lines 402 to respective ones of bitlines 416, or the like, to facilitate memory operations.

Figure 5:
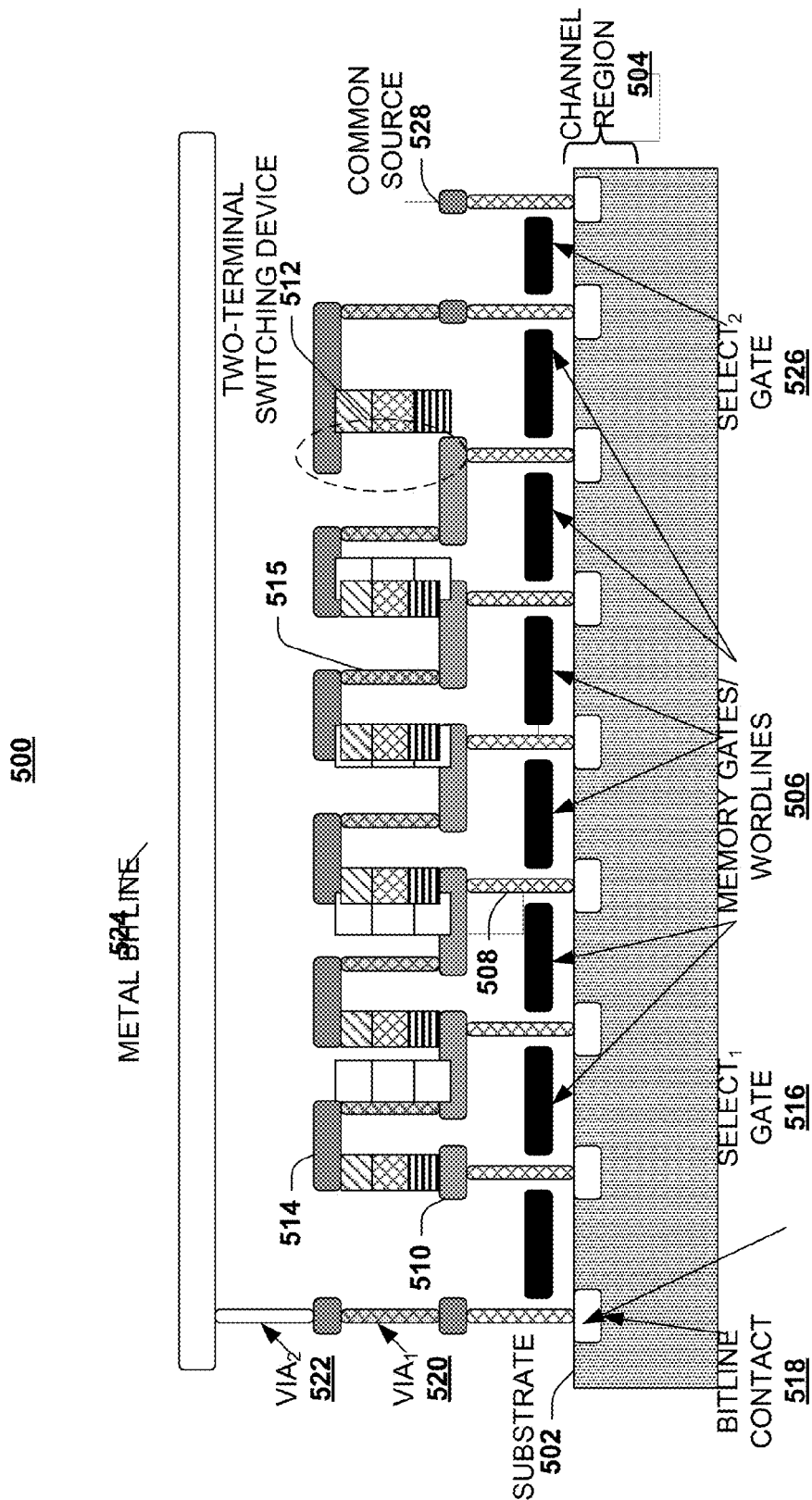
FIG. 5 depicts a block diagram of a sample side view of the NAND array of FIG. 4.

FIG. 5 illustrates a block diagram of a side view of an example memory architecture 500 for two-terminal memory devices, according to one or more embodiments of the subject disclosure. In some embodiments, memory architecture 500 can be substantially similar to memory architecture 500 of FIG. 4, supra. However, the subject disclosure is not limited to these embodiments, as in at least some embodiments, memory architecture 500 can differ from memory architecture 400 as would be appreciated by one of ordinary skill in the art.

Memory architecture 500 can comprise a substrate 502, which can be a CMOS-related substrate in some embodiments. A diffusion line can form a channel region 504 of a set of transistors, as depicted. In other embodiments of the subject disclosure, channel regions of the set of transistors can be formed above the diffusion line (e.g., in a vertical transistor arrangement as utilized for three dimensional transistor arrangements) or can be formed absent a substrate region, in some embodiments. The set of transistors can have at least three-terminals (e.g., having three terminals, four terminals, and so forth). In some embodiments, the set of transistors can be three-terminal transistors having respective source terminals and drain terminals within channel region 504, and respective gate terminals formed by wordlines 506, 516, 526 above substrate 502. The gate terminals can include memory cell transistor gates 506, as well as a first select transistor gate select₁ gate 516, and a second select transistor gate, select₂ gate 526.

A first set of vertical contacts 508 connect respective ones of transistor terminals in channel region 504 to respective ones of a first set of metal interconnects, M1 interconnects 510. Two-terminal switching devices 512 are formed atop M1 interconnects 510. In at least one embodiment, two-terminal switching devices 512 have a first contact (horizontal shading) electrically connected to respective ones of M1 interconnects 510. One or more switching media (cross-hatched shading) can be formed to have one or more states for storing digital information, and a second contact (diagonal shading) can be electrically connected to respective ones of a second set of metal interconnects, M2 interconnects 514. In some embodiments, two-terminal switching devices 512 can be non-volatile two-terminal memory devices. In further embodiments, two-terminal switching devices 512 can comprise resistive memory devices, ferromagnetic memory devices, phase change memory devices, magneto-resistive memory devices, organic memory devices, conductive bridging memory devices, or the like, or a suitable combination thereof.

To form a parallel arrangement between respective ones of two-terminal switching devices 512 and respective ones of the three-terminal transistor components (respectively comprising a source and drain terminal within channel region 504, and a memory gate 506), a second set of vertical vias 515 electrically connect respective ones of M2 interconnects 514 and to adjacent ones of M1 interconnects 510, as depicted. At the left end of memory architecture 500, a select transistor is formed by $select_1$ gate 516, a first channel region 504 terminal (a source or drain of the select transistor) and a second channel region 504 terminal (a drain/source of the select transistor). The first channel region 504 terminal of the select transistor is a bitline contact 518, connected to a bitline M1 interconnect by one of first set of vertical contacts 508, as depicted. A first via, $via_1$ 520, connects the bitline M1 interconnect to a bitline M2 interconnect. Further, a second via, $via_2$ 522, connects the bitline M2 interconnect to a bitline 524.

At the right end of memory architecture 500, a second select transistor is formed by $select_2$ gate 526, and the two right-most channel region 504 terminals. One channel region 504 terminal of the second select transistor is connected by one of vertical contacts 508 to a common source line 528, which can be shared by one or more other memory cell arrays similar to memory architecture 500. By applying suitable operation signals (e.g., program signals, read signals, erase signals, and so forth) to bitline 524 and common source line 528, and suitable control of the first select transistor and second select transistor, memory operations can be performed on one or more memory cells of memory architecture 500, as described herein (e.g., see FIG. 2, supra). Moreover, individual memory cells of memory architecture 500 can be selected or unselected for memory operations by control of memory gates 506. For instance, a memory gate at high voltage can cause an associated channel region 504 to conduct electricity, thereby activating an associated three-terminal transistor component, and bypassing an associated two-terminal switching device 512. In contrast, a memory gate at low voltage can cause an associated channel region 504 to have high electrical resistance, deactivating an associated three-terminal transistor component, and causing a signal to propagate through an associated two-terminal switching device 512. Selective control of three-terminal transistor components can therefore serve to select or unselect associated two-terminal memory devices 512 for memory operations.

In various embodiments, two-terminal memory devices of memory architecture 500 can be unipolar or bipolar devices, such as unipolar resistive switching devices (e.g., a unipolar resistive random access memory) or bipolar resistive switching devices (e.g., a bipolar resistive random access memory). For bipolar two-terminal memory devices, a first polarity can be employed for programming operations of a selected one(s) of the bipolar two-terminal memory devices, and a second polarity can be employed for erase operations of another selected one(s) of the bipolar two-terminal memory devices. Furthermore, for unipolar two-terminal memory devices a programming signal having a polarity and a first magnitude suitable for programming a selected one(s) of the unipolar two-terminal memory devices can be employed for the programming, whereas an erase signal having the same polarity and a second magnitude (e.g., a larger magnitude than the first magnitude, a smaller magnitude than the first magnitude) suitable for erasing one or more unipolar two-terminal memory devices can be employed for erasing the unipolar two-terminal memory devices.

The aforementioned diagrams have been described with respect to interaction between several components of a memory cell, memory arrays, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a deposition process can comprise a fill or etching process, an anneal process, or the like, or vice versa, to facilitate deposition, filling or etching of memory cell layers by way of an aggregate process. Components of the disclosed architectures can also interact with one or more other components not specifically described herein but known by those of skill in the art.

Figure 6:
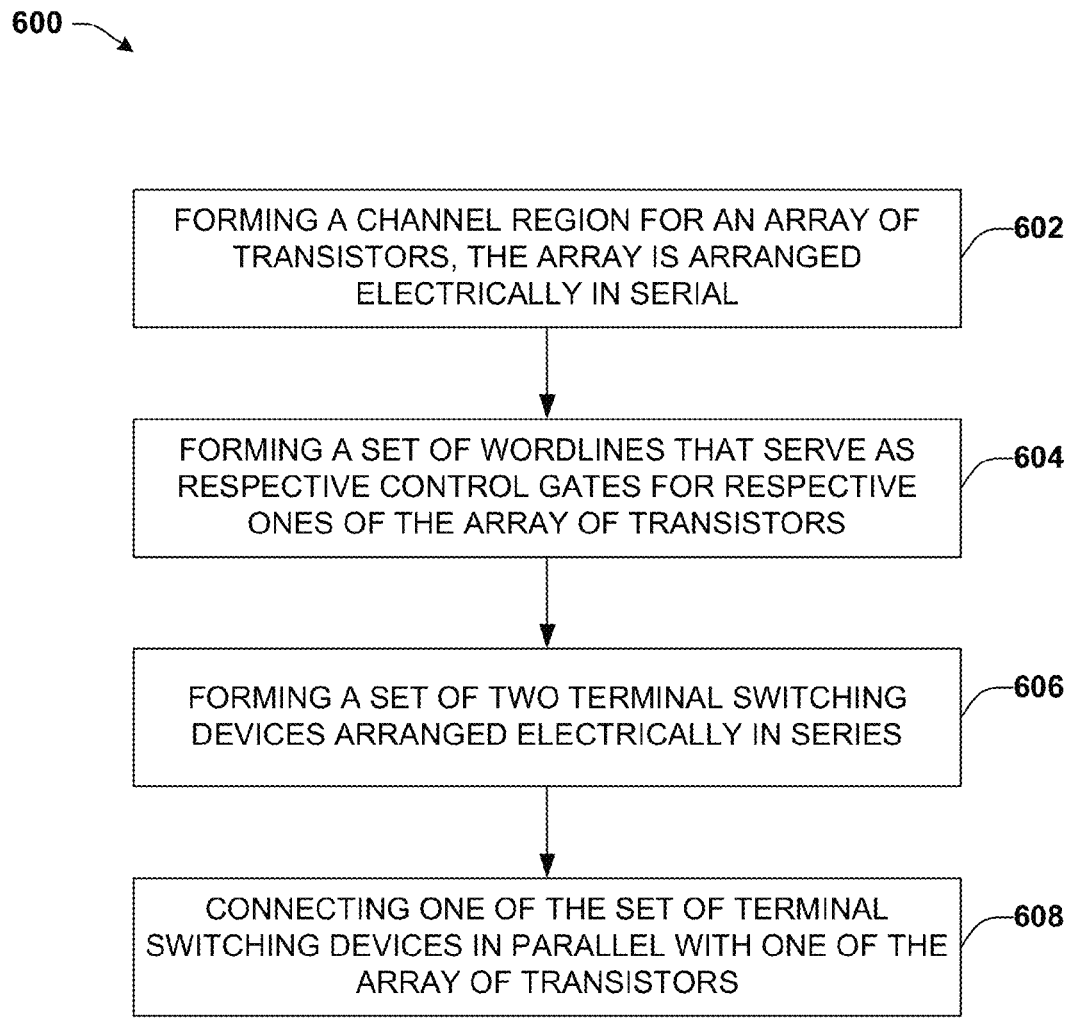
FIG. 6 illustrates a flowchart of an example method for fabricating electronic memory according to one or more embodiments of the subject disclosure.
Figure 7:
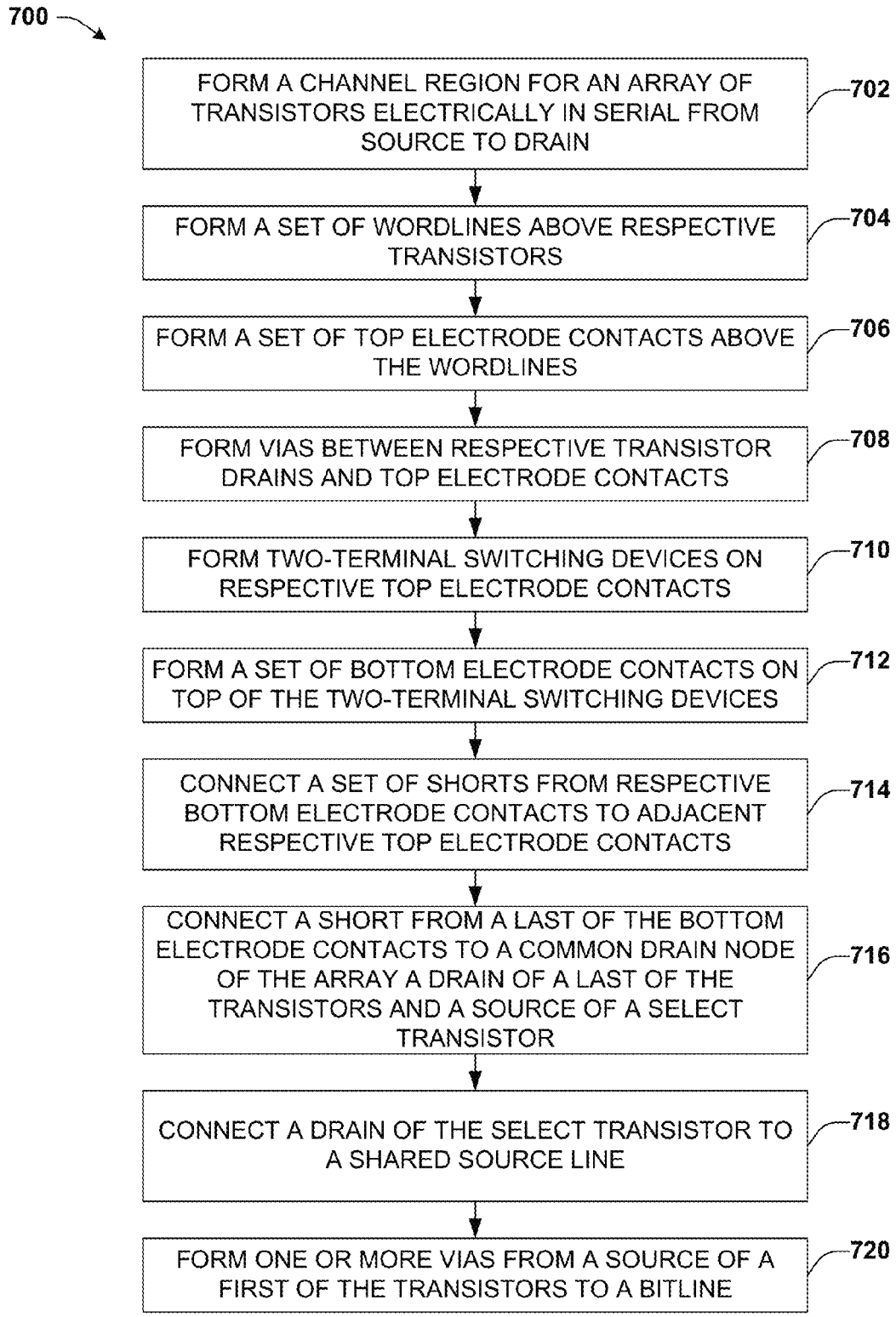
FIG. 7 depicts a flowchart of a sample method for fabricating a 1T-1D NAND array according to further embodiments.

In view of the exemplary diagrams described supra, process methods that can be implemented in accordance with the disclosed subject matter will be better appreciated with reference to the flow charts of FIGS. 6 and 7. While for purposes of simplicity of explanation, the methods of FIGS. 6 and 7 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 6 illustrates a flowchart of an example method 600 for fabricating a memory array according to one or more embodiments of the subject disclosure. At 602, method 600 can comprise forming a channel region for an array of transistors. The channel region can be formed, in one or more disclosed aspects, by arranging the array of transistors electrically in series from source to drain. At 604, method 600 can comprise forming a set of wordlines for the memory array. In at least one aspect, respective ones of the set of wordlines can be formed so as to serve as a control gate for respective ones of the array of transistors. In addition to the foregoing, at 606, method 600 can comprise forming a set of two-terminal switching devices arranged electrically in series from respective first terminals to respective second terminals of the set of two terminal switching devices. Furthermore, at 608, method 600 can comprise connecting one of the set of two terminal switching devices in parallel with one of the array of transistors. This electrical parallel arrangement can be accomplished by connecting a first terminal (e.g., top electrode, bottom electrode) of the one of the set of two terminal switching devices to a corresponding first terminal (e.g., source, drain) of the one of the array of transistors, and connecting a second terminal (e.g., bottom electrode, top electrode) of the one of the set of two terminal switching devices to a corresponding second terminal (e.g., drain, source) of the one of the array of transistors. Furthermore, the one of the two terminal transistors can be formed so as to have a higher resistance, when deactivated, than the one of the two terminal switching devices, and to have a lower resistance, when activated, than the one of the two-terminal switching devices. Accordingly, a signal applied to the parallel circuit propagates primarily through the one of the array of transistors when the latter is activated, and primarily through the one of the two terminal switching devices when the one of the array of transistors is deactivated.

FIG. 7 illustrates a flowchart of an example method 700 for forming a 1T-1D NAND array according to one or more additional aspects of the subject disclosure. At 702, method 700 can comprise forming a channel region for an array of transistors. In some embodiments, the channel region can be formed within a semiconductor substrate. In other embodiments, the channel region can be formed in part or in whole above the semiconductor substrate (e.g., in a vertical three-dimensional arrangement) and in still other embodiments, the channel region can be formed without a semiconductor substrate. The channel region can be formed to cause the array of transistors to be electrically in serial from respective source terminals to respective drain terminals thereof. At 704, method 700 can comprise forming a set of wordlines above the channel region for respective ones of the array of transistors. At 706, method 700 can comprise forming a set of top electrode contacts above the wordlines, and at 708, method 700 can comprise forming vias between respective transistor drain terminals of the array of transistors and respective ones of the top electrode contacts.

At 710, method 700 can comprise forming a set of two-terminal switching devices on respective top electrode contacts of the set of top electrode contacts. At 712, method 700 can comprise forming a set of bottom electrode contacts on top of the two-terminal switching devices. In addition, at 714, method 700 can comprise connecting a set of electrical shorts from respective bottom electrode contacts to adjacent respective top electrode contacts. At 716, method 700 can comprise connecting a short between a last of the bottom electrode contacts to a common drain node of the array, where the common drain node is shared as a drain terminal of a last transistor in the array of transistors and as a source terminal of a select transistor. At 718, method 700 can comprise connecting a drain of the select transistor to a shared source line, and at 720, method 700 can comprise forming one or more vias from a source of a first of the transistors of the array of transistors, to a bitline.

Figure 8:
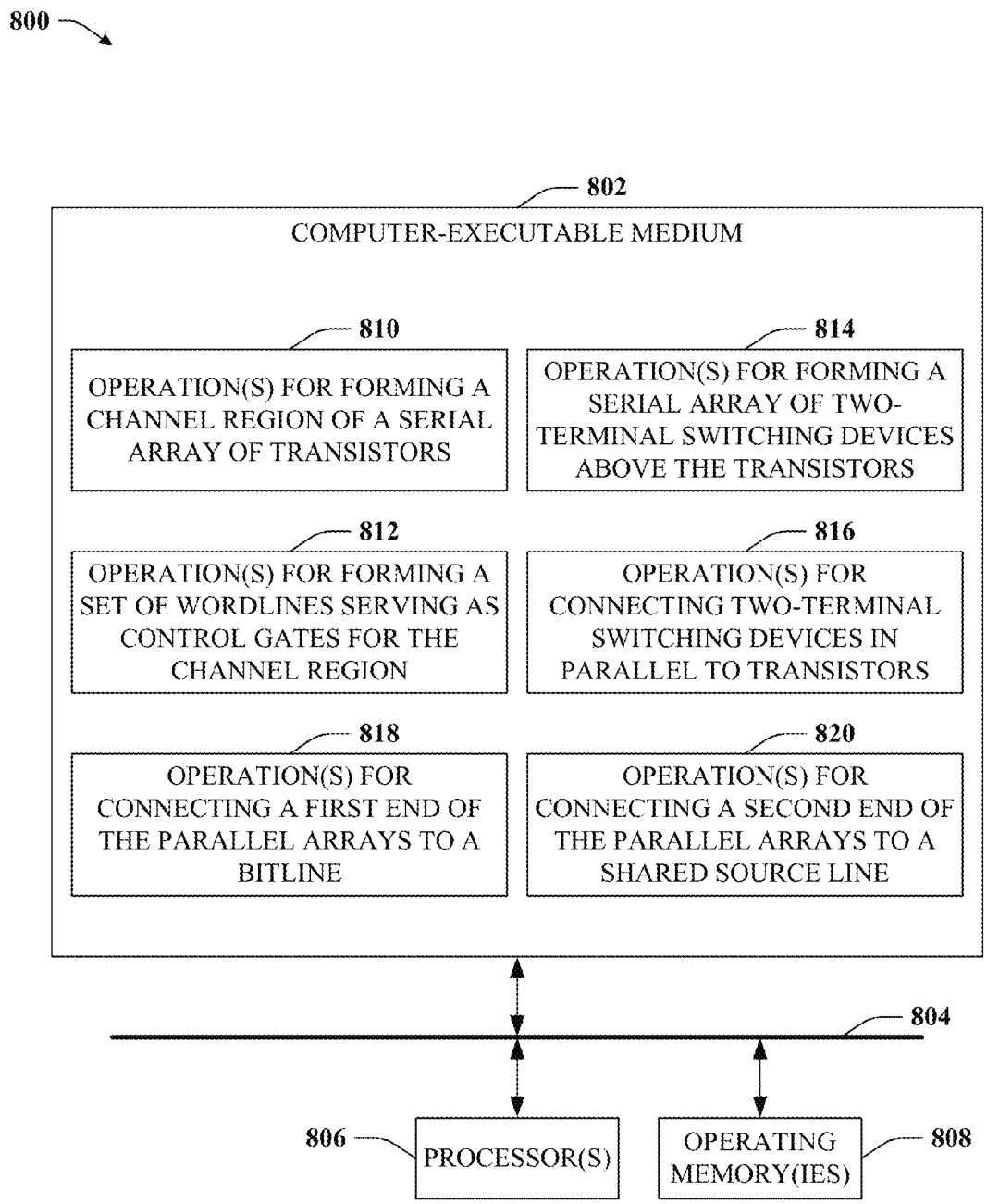
FIG. 8 illustrates a block diagram of an example computing system comprising instructions for fabricating a NAND array according to another embodiment.

FIG. 8 illustrates a block diagram of an example apparatus 800 for implementing one or more aspects of the subject disclosure. Particularly, apparatus 800 can be configured for providing 1T-1D arrangement of memory cells arranged in a NAND array, respectively comprising a parallel circuit of a three-terminal transistor and a two-terminal memory device. For instance, apparatus 800 can reside at least partially within an electronic device, a memory, a memory module, a handheld computer, a personal computer, a networked computer, or the like. It is to be appreciated that apparatus 800 is represented as including functional blocks, which can be functional blocks that represent functions implemented by a hardware, software, or combination thereof (e.g., firmware). In some aspects, the functional blocks can represent non-transitory computer-readable media. In other aspects, the functional blocks can represent transitory computer-readable media.

Apparatus 800 can comprise an electronically executable component 802 comprising stored operations that, once executed, facilitate the fabricating a 1T-1D NAND array. Electronically executable component 802 can be operated, executed or accessed over a data communication interface 804. Data communication interface 804 can include a data bus, a dataline, a bitline, a wired or wireless communication interface, a network or network interface, or the like, or a suitable combination thereof. In at least one aspect of the subject disclosure, a subset of the stored operations for facilitating fabrication of the 1T-1D NAND array can include computer-executable instructions stored in an operating memory(ies) 808 or executed by a processor(s) 806 to facilitate functionality of apparatus 800. In another aspect, one or more of the stored operations can be replaced by one or more electrically, mechanical, or electro-mechanical means for executing the operations, in response to activation by a processor means or a mechanical automation means.

As depicted, electronically executable component 802 can comprise operations 810 for forming a channel region of a serial array of transistors (e.g., in a semiconductor substrate, in a vertical arrangement above the semiconductor substrate, or without the semiconductor substrate), and operations 812 for forming a set of wordlines over the channel region serving as control gates for respective ones of the array of transistors. Furthermore, electronically executable component can comprise operations 814 for forming a serial array of two-terminal switching devices above respective ones of the transistors, and operations 816 for connecting respective ones of the two-terminal switching devices in parallel to respective ones of the transistors. In addition to the foregoing, electronically executable component 802 can comprise operations 818 for connecting a first end of the parallel arrays to a bitline, and operations 820 for connecting a second end of the parallel arrays to a shared source line.

Figure 9:
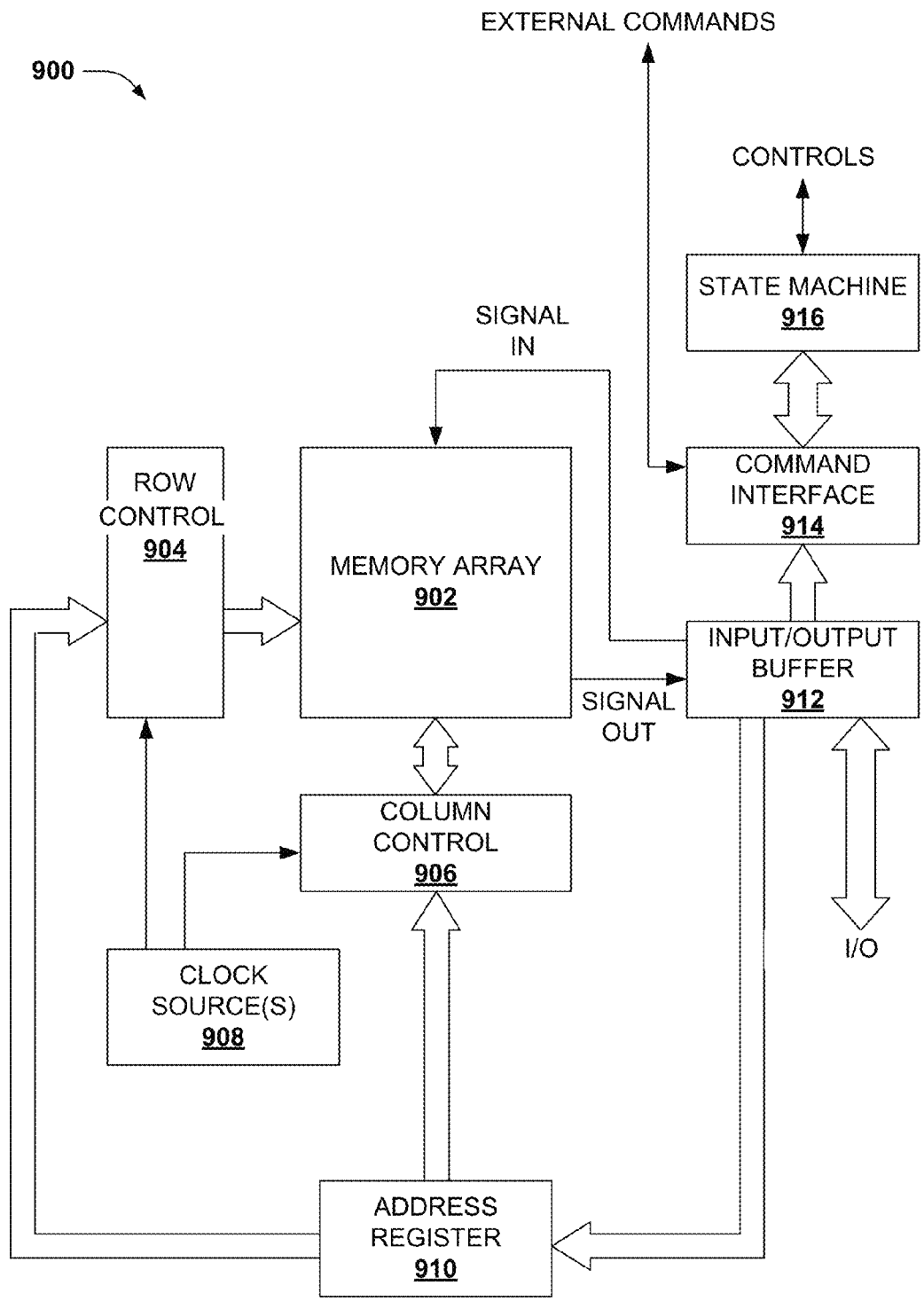
FIG. 9 depicts a block diagram of a sample operating environment for facilitating implementation of one or more aspects disclosed herein.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methods for fabricating or operating such architectures, those skilled in the art will recognize that the subject disclosure also can be implemented in combination with other architectures or process methods. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 9 illustrates a block diagram of an example operating and control environment 900 for a memory cell array 902 according to aspects of the subject disclosure. In at least one aspect of the subject disclosure, memory cell array 902 can comprise a variety of memory cell technology. Particularly, memory cell array 902 can comprise two-terminal memory such as resistive-switching memory cells. In various embodiments, memory cell array 902 can be a NAND array comprising two-terminal memory. In at least one embodiment, memory cell array 902 can be a NAND array having respective memory cells that comprise a 1T-1D parallel circuit, as described herein.

A column controller 906 can be formed adjacent to memory cell array 902. Moreover, column controller 906 can be electrically coupled with bit lines of memory cell array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of memory cell array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to memory cell array 902 via signal input lines, and output data is received from memory cell array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of memory cell array 902. State machine 916 receives commands from the host apparatus via input/output interface 912 and command interface 914, and manages read, write, erase, data input, data output, and like functionality associated with memory cell array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
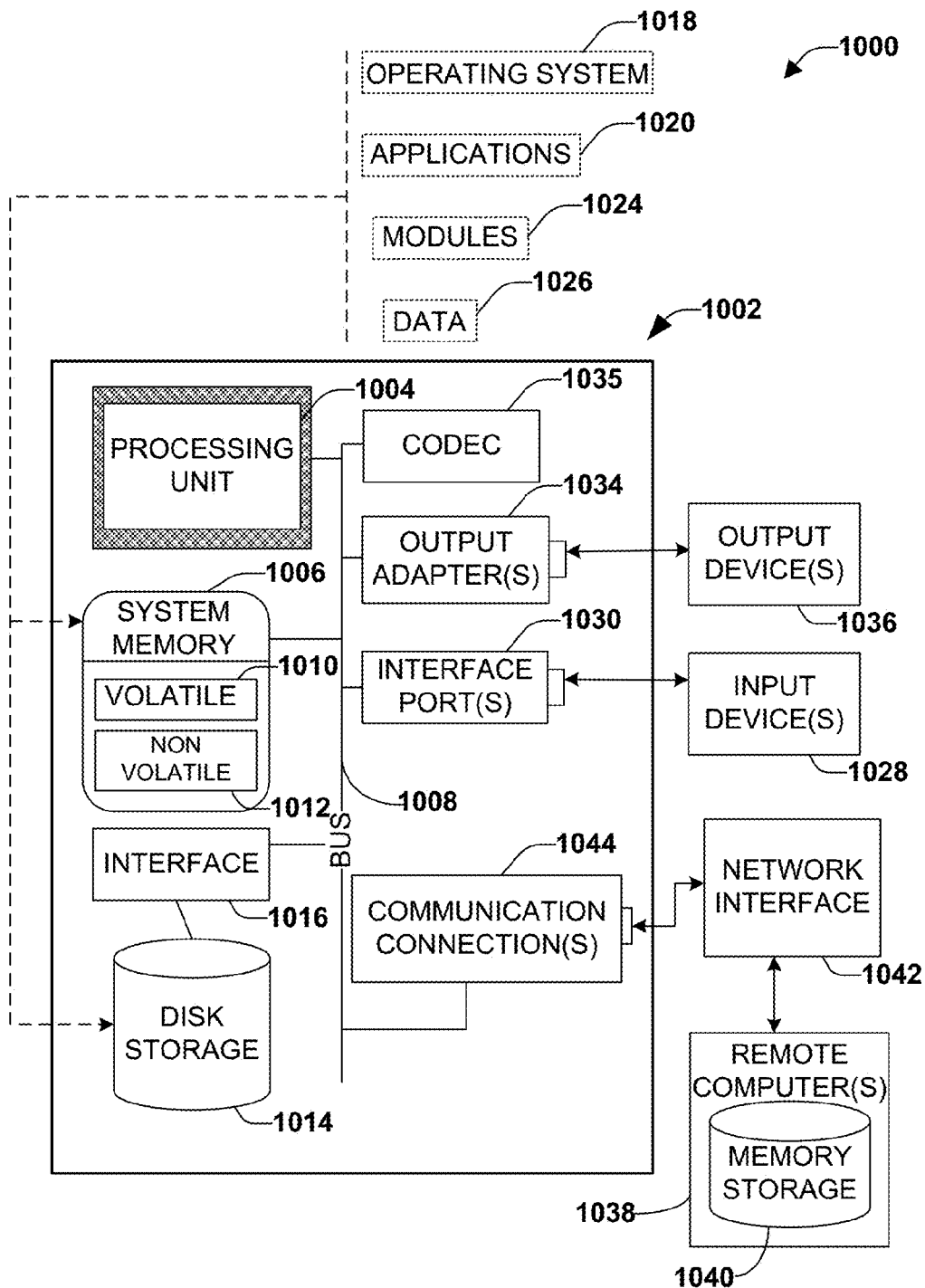
FIG. 10 illustrates a block diagram of an example computing environment that can be implemented in conjunction with various embodiments.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device's) 1036) of the types of information that are stored to disk storage 1014 and/or transmitted to the server or application. The user can be provided the opportunity to opt-in or opt-out of having such information collected and/or shared with the server or application (e.g., by way of input from input device(s)) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory device, comprising:
an array of memory cells comprising:
an array of transistor components; and
an array of two-terminal multi-state components, wherein:
the array of memory cells is arranged electrically in series from respective first terminals to respective second terminals of respective ones of the memory cells,
a transistor component of the array of transistor components is connected electrically in parallel with a two-terminal multi-state component of the array of two-terminal multi-state components and wherein the transistor component is formed at least in part within a substrate of the memory;
a signal applied to the array of memory cells propagates through the at least one of the memory cells primarily via the transistor component in response to the transistor component being activated, and
the signal propagates through the at least one of the memory cells primarily via the two-terminal multi-state component in response to the transistor component being de-activated; and a second array of memory cells, further wherein:
the array of memory cells and the second array of memory cells terminate at respective select transistors that are connected to a first bitline and to a second bitline, respectively, and further wherein the respective select transistors are commonly activated by a word line,
the two-terminal multi-state component of the array of two-terminal multi-state components is configured to be programmed or erased in response to activation of the wordline and in response to application of the signal at the first bitline, and
application of an inhibit signal to the second bitline mitigates programming or erasing of the second array of memory cells in response to activation of the wordline.

2. The memory of claim 1, wherein respective memory cells of the array of memory cells are arranged electrically in serial.

3. The memory of claim 1, wherein the transistor component is a semiconductor transistor having at least three terminals.

4. The memory of claim 3, wherein the semiconductor transistor comprises a channel region within the substrate and a gate overlying the substrate.

5. The memory of claim 1, wherein the two-terminal multi-state component is a non-volatile resistive-switching device.

6. The memory of claim 1, wherein the two-terminal multi-state component is a resistive memory, a ferromagnetic memory, a phase change memory, a magneto-resistive memory, an organic memory, or a conductive bridging memory.

7. The memory of claim 1, further comprising a gate oxide overlying the substrate, wherein the array of transistor components having transistor channel regions formed within the substrate and below the gate oxide and having transistor gates formed above the gate oxide.

8. The memory of claim 7, wherein a set of wordlines of the memory device serve as the transistor gates for the array of memory cells.

9. The memory of claim 7, wherein the respective ones of the memory cells comprise respective ones of the array of two-terminal multi-state components.

10. The memory of claim 9, wherein the respective ones of the array of two-terminal multi-state components are:
arranged respectively in electrical parallel with the respective ones of the set of transistors; and
formed above the substrate of the memory and above respective ones of the array of transistor components.

11. The memory of claim 9, wherein the array of transistor components are arranged electrically in series from source to drain.

12. The memory of claim 11, wherein the array of two-terminal multi-state components are respectively arranged in electrical series, wherein respective ones of the array of two-terminal multi-state components are in electrical parallel to respective ones of the array of transistor components.

13. The memory of claim 1, further comprising:
an electrical short connecting a first electrode of the two-terminal multi-state component to a first node of the transistor component; and
a second electrical short connecting a second electrode of the two-terminal multi-state component to a second node of the transistor component.

14. The memory of claim 1, further comprising:
a bitline contact connected to a first end of the array of memory cells for powering the array of memory cells; and
a common source line connected to a second end of the array of memory cells and to a first end of a second array of memory cells of the memory, and configured to facilitate selecting or deselecting the array of memory cells or the second array of memory cells for a memory operation.

15. An electronic device, comprising:
a memory configured to store or read data by performing a memory operation; and
a memory controller communicatively connected to the memory and configured to implement the memory operation with respect to an array of memory cells associated with the electronic device and to inhibit the memory operation with respect to a second array of memory cells associated with the electronic device, the array of memory cells comprising an array of transistor components and an array of multi-state resistive switching components and is connected at one end of the array of memory cells to a select transistor that, when activated, couples the one end of the array of memory cells to a first bitline, the second array of memory cells is connected at one end of the second array to a second select transistor that, when activated, couples the one end of the second array to a second bitline, and wherein the select transistor and the second select transistor are commonly activated by a wordline, and wherein the memory controller is configured to program or erase one of the multi-state resistive switching components of the array of memory cells in response to applying a program or erase signal to the first bitline and is configured to mitigate programming or erasing of the second array of memory cells in response to applying an inhibit signal to the second bitline, wherein:
the array of memory cells is electrically connected in series from respective first terminals to respective second terminals of respective ones of the array of memory cells;
a memory cell of the array of memory cells comprises a transistor component of the array of transistor components that is connected electrically in parallel with a multi-state resistive switching component of the array of multi-state resistive switching components, wherein the transistor component is formed at least in part within a substrate of the memory;
the multi-state resistive switching component is inhibited from the memory operation in response to the transistor component being activated; and
the multi-state resistive switching component is enabled for the memory operation in response to the transistor component being de-activated.

16. The electronic device of claim 15, wherein the memory operation is a read operation, a write operation or an erase operation, and further wherein the memory controller is configured to select and apply a read signal, a write signal or an erase signal, respectively, to the memory cell to facilitate execution of the read operation, the write operation or the erase operation, respectively, on the multi-state switching component in response to the multi-state switching component being enabled for the memory operation.

17. The electronic device of claim 15, wherein the array of transistor components comprise respective channel regions formed within the substrate and respective transistor gates formed overlying the substrate.

18. The electronic device of claim 17, wherein the array of multi-state resistive switching components comprise respective sets of electrical contacts connected to respective channel regions of associated ones of the array of transistor components.

19. The electronic device of claim 18, wherein the respective sets of electric contacts extend onto the substrate to connect to the respective channel regions.

20. The electronic device of claim 17, wherein a set of wordlines of the memory serve as the transistor gates for the array of transistor components.

* * * * *